(12) United States Patent
Wei

(10) Patent No.: US 7,727,855 B2
(45) Date of Patent: Jun. 1, 2010

(54) FABRICATION OF ALIGNED NANOWIRE LATTICES

(75) Inventor: Qingqiao Wei, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1 day.

(21) Appl. No.: 11/842,818

(22) Filed: Aug. 21, 2007

(65) Prior Publication Data

US 2008/0009121 A1 Jan. 10, 2008

Related U.S. Application Data

(62) Division of application No. 11/169,470, filed on Jun. 29, 2005, now Pat. No. 7,276,424.

(51) Int. Cl.
*H01L 21/76* (2006.01)

(52) U.S. Cl. ................. 438/406; 977/762; 977/840

(58) Field of Classification Search ............... 438/406, 438/455; 977/762, 890
See application file for complete search history.

(56) References Cited

U.S. PATENT DOCUMENTS

| | | | |
|---|---|---|---|
| 6,187,165 B1 | 2/2001 | Chien et al. | |
| 6,248,674 B1 | 6/2001 | Kamins et al. | |
| 6,329,070 B1 | 12/2001 | Sass et al. | |
| 6,383,923 B1 | 5/2002 | Brown et al. | |
| 6,407,443 B2 | 6/2002 | Chen et al. | |
| 6,656,573 B2 | 12/2003 | Chen et al. | |
| 6,831,017 B1 | 12/2004 | Li et al. | |
| 6,942,921 B2 * | 9/2005 | Rueckes et al. | 428/408 |
| 2001/0044200 A1 | 11/2001 | Chen et al. | |
| 2002/0053053 A1 | 5/2002 | Nagai et al. | |
| 2002/0078881 A1 | 6/2002 | Cuomo et al. | |
| 2002/0086534 A1 | 7/2002 | Cuomo et al. | |
| 2002/0175408 A1 | 11/2002 | Majumdar et al. | |
| 2003/0052006 A1 | 3/2003 | Noca et al. | |
| 2003/0186522 A1 | 10/2003 | Duan et al. | |
| 2004/0067602 A1 | 4/2004 | Jin | |
| 2004/0105810 A1 | 6/2004 | Ren et al. | |
| 2004/0146560 A1 | 7/2004 | Whiteford et al. | |
| 2005/0011431 A1 | 1/2005 | Samuelson et al. | |

FOREIGN PATENT DOCUMENTS

WO    WO 2004/087564    10/2004

OTHER PUBLICATIONS

R. Wind et al, "Fabrication of Nanoperiodic Surface Structures by Controlled Etching of Dislocations in Bicrystals", Applied Physics Letters, vol. 78, No. 15, Apr. 9, 2001.*

(Continued)

*Primary Examiner*—Steven Loke
*Assistant Examiner*—Suberr Chi

(57) ABSTRACT

Methodologies associated with fabricating aligned nanowire lattices are described. One exemplary method embodiment includes providing a twist wafer bonded thin single crystal semiconductor film and a bulk single crystal substrate of the same material. Periodic non-uniform elastic strains present on the surface of the film control the positions where nanocrystals will form on the film. The strains may be removed via annealing and alloying after the formation of nanocrystal arrays.

13 Claims, 4 Drawing Sheets

OTHER PUBLICATIONS

R.S. Wagner and W.C. Ellis, "Vapor-Liquid-Solid Mechanism of Single Crystal Growth", Applied Physics Letters, vol. 4, No. 5, Mar. 1, 1964, p. 89-90.*

R. Khorenko et al, "Photoluminescence of GaAg Nanowhiskers Grown on Si Substrate", Applied Physics Letters, Dec. 27, 2004, vol. 85, No. 26, p. 6407-6408.*

Selvaduray, Dr. Guna. Page 19 of "Binary Phase Diagrams". San Jose State University Materials Engineering Program. Aug. 10, 2009. <www.sjsu.edu/faculty/selvaduray/page/phase/binary_p_d.pdf>.*

Scheerschmidt, K. and Kuhlmann, V., "Molecular Dynamics Investigation of Bonded Twist Boundaries", 2004, Interface Science, 12, pp. 157-163, Kluwer Academic Pub. Netherlands.*

Poydenot V et al., Highly ordered germanium nanostructures grown by molecular beam epitaxy on twist-bonded silicon (001) substrates, Journal of Crystal Growth, Feb. 16, 2005.

International Search Report and Written Opinion of the International Searching Authority dated Nov. 24, 2006.

* cited by examiner

FABRICATION OF ALIGNED NANOWIRE LATTICES

This application is a divisional of Ser. No. 11/169,470, filed Jun. 29, 2005, now U.S. Pat. No. 7,276,424 which is hereby incorporated by reference.

BACKGROUND

The basic process of nanowire formation on substrates by the VLS (vapour-liquid-solid) mechanism is well known. A particle of a catalytic material, (e.g., gold) on a substrate is heated in the presence of certain gases to form a melt. A pillar forms under the melt and the melt rises up on top of the pillar. The result is a nanowire of a desired material with the solidified particle melt positioned on top. While nanowire formation is well known, precise control of nanowire growth locations, growth directions, and growth alignment into lattices is not.

In VLS semiconductor nanowire growth, the positions of seed nanocrystals may determine the location of nanowire development. Typically, the positioning of nanocrystals has not been controlled to a desired degree of precision and/or uniformity. This has lead to nanowires developing at random and/or unacceptable locations on the substrate. These random patterns limit nanowire applications in photonics, sensors, electronics, and so on.

Conventionally, an additional nanopatterning step may have been added before nanocrystal nucleation in an attempt to control the nanocrystal position. For example, a silicon oxide mask with regular openings may be generated on top of a substrate to attempt to contain nanocrystals within the openings. However, the nanocrystal positions may still not be precisely controllable because the mask opening size is usually larger than the nanocrystal size. Thus, the nanocrystals may shift their positions within the openings. Additionally, the single crystal substrate surface may be contaminated during the mask patterning step and by the mask itself. This will interfere with the epitaxial growth of nanowires and may lead to nanowire growth in uncontrolled directions. These misaligned nanowires have limited value if any in applications like photonics, sensors, and electronics for example.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
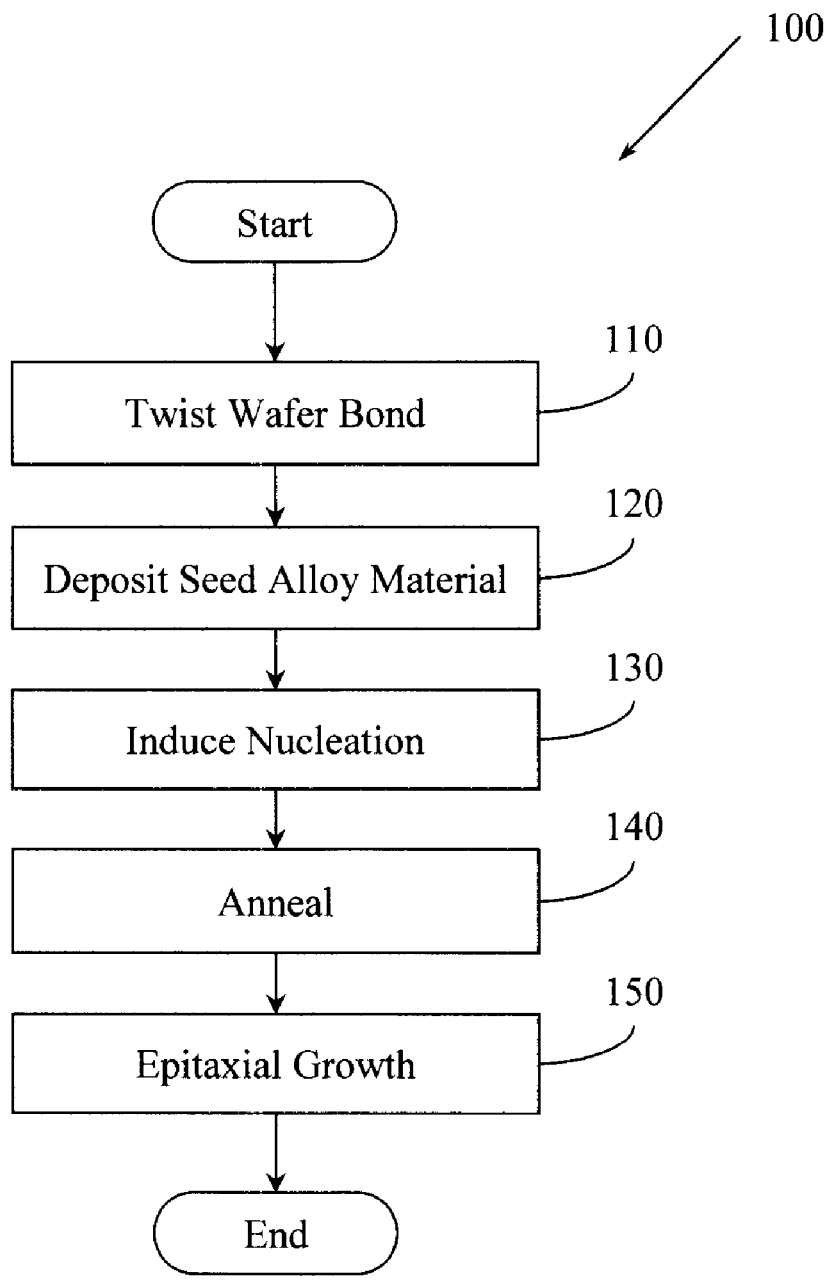
FIG. 1 illustrates an example method for fabricating aligned semiconductor nanowire lattices.

Example methods described herein relate to nanotechnology. Example methods concern structurally ordered nanostructure compositions (e.g., non-randomly oriented and/or arranged nanostructures), as well as related methods for producing these nanostructures. In one example, periodic non-uniform elastic fields on the surface of a thin single crystal semiconductor can be used advantageously to control the nucleation sites of nanocrystals.

Nanotechnology covers various fields including that of nanoengineering, which may be regarded as practicing engineering on the nanoscale. Engineering on the nanoscale may produce structures with atomic dimensions to larger scale structures with microscopic dimensions. Thus, nanoscale engineering may produce nanostructures. Typically, nanostructures are devices having at least two dimensions less than about 1 μm (e.g., nanometer dimensions). Although the exact boundaries of the class of nanostructures are not defined by a particular numerical size limit, the term has come to signify a class that is readily recognized by those skilled in the art.

When a thin single crystal semiconductor film is twist-wafer bonded to a bulk single crystal substrate of the same material, periodic dislocation arrays at the interface between the film and the substrate may induce periodic nonuniform elastic fields on the surface of the film. These fields control the nucleation sites of self-assembled quantum dots (e.g., nanocrystals) resulting periodic arrays of nanocrystals on the surface of the film. These nanocrystal arrays can be used as the alloying seeds employed in growing semiconductor nanowires using an epitaxial VLS mechanism. Before growing the nanowires, dislocations and associated strains beneath the seed nanocrystals may be relieved by annealing and alloying the seed nanocrystals and the thin semiconductor film underneath. Thus, aligned nanowires and nanowire lattices can subsequently be formed using epitaxial growth. These aligned semiconductor nanowire lattices may be suitable for applications in sensors, electronics, photonics, lighting, displays and so on.

Silicon can take a crystal form, a crystal being a solid featuring periodic spatial arrangements of atoms throughout the entire piece of material. Crystals may have defects. The defects may take the form of imperfections of the crystallographic structure of a crystal. One imperfection is a dislocation, which may also be referred to as a line defect. Silicon has a bipartite lattice with mobile dislocations including the screw and the sixty degree dislocation.

Epitaxy is a process by which thin epitaxial layers of a single crystal material are deposited on a single crystal substrate. A single crystal material is a crystalline solid in which atoms are arranged following a specific pattern through the material. Thus, single crystal materials feature long-range order throughout the material. Contrast this with poly-crystalline materials that feature long-range order only within limited grains. Thin single crystal materials may be substantially crystalline as that term is defined herein. Epitaxial growth leads to reproducing the crystallographic structure of the substrate in the growing material. The reproduction includes reproducing defects of the substrate in the growing material. Epitaxy is a deposition that occurs due to a chemical reaction. The process exploits the creation of a solid material directly from a chemical reaction in a gas and/or liquid composition.

In example methods, a crystalline substrate may be used to facilitate growing nanowires. The substrate may be used to set a pattern for the growth of material in which the crystalline pattern is reproduced. Thus, if the substrate is an ordered semiconductor crystal like Si, then it may be possible to build a nanowire onto the substrate with the same crystallographic orientation. The growth direction of nanowires is determined by the crystallographic orientation of the substrate. To grow nanowires via the VLS mechanism, seed nanocrystal seed alloy material may be used to initiate unidirectional growth. The locations of nanowires are determined by the locations of seed nanocrystals. Periodic arrays of nanowires can be grown from periodic arrays of seed nanocrystals.

The following includes definitions of selected terms employed herein. The definitions include various examples and/or forms of components that fall within the scope of a term and that may be used for implementation. The examples are not intended to be limiting. Both singular and plural forms of terms may be within the definitions.

"A", as used herein, and the singular forms "a", "an" and "the" may include plural referents unless the content clearly dictates otherwise. Thus, for example, reference to "a substrate" may optionally include a combination of two or more substrates and a reference to a "nanowire" may optionally include mixtures of nanowires, and so on.

An "aspect ratio" is the length of a first axis of a nanostructure divided by the average of the lengths of the second and third axes of the nanostructure, where the second and third axes are the two axes whose lengths are most nearly equal each other. For example, the aspect ratio for a perfect rod would be the length of its long axis divided by the diameter of a cross-section perpendicular to (normal to) the long axis.

The terms "crystalline" or "substantially crystalline", when used with respect to nanostructures, describe the phenomenon that nanostructures may exhibit long-range ordering across one or more dimensions of the structure. It will be appreciated by one skilled in the art that the term "long range ordering" depends on the absolute size of the specific nanostructures, as ordering for a single crystal cannot extend beyond the boundaries of the crystal. In this case, "long-range ordering" refers to substantial ordering across at least the majority of the dimension of the nano-structure. Thus, in some examples, the terms "crystalline" or "substantially crystalline" are intended to encompass structures including various defects, stacking faults, atomic substitutions, and the like, as long as the structure exhibits substantial long range ordering (e.g., over at least 80% of the length) of at least one axis of the nanostructure or its core.

In some instances, a nanostructure like a nanocrystal may have an oxide or other coating, or may include a core and a shell. In these instances it will be appreciated that the oxide, shell(s), or other coating may not exhibit long range ordering and thus may be amorphous, polycrystalline, or otherwise. In these instances, the phrases "crystalline," "substantially crystalline," "substantially monocrystalline," or "monocrystalline" refer to the central core of the nano-structure excluding the coating layers or shells. In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

"Nanowire", as employed herein, refers to a nanostructure having one principle axis longer than its other two principle axes. Consequently, a nanowire has an aspect ratio greater than about 1.5 or greater than about 2. Short nanowires, sometimes referred to as "nanorods," typically have an aspect ratio between about 1.5 and about 10. Longer nanowires may have an aspect ratio greater than about 10, or even greater than about 10,000. The diameter of a nanowire is typically less than about 500 nm and may be less than 200 nm. In some examples, the diameter of a nanowire may even be less than about 5 nm. The length of a nanowire may be greater than about 100 nm and may even be up to about 1000 nm.

"Nucleation" refers to the initiation of the process for epitaxial growth by the VLS method. Nucleation includes, upon the application of heat, absorbing atoms of the nanowire material into the catalytic material to form an alloy. When supersaturation conditions are achieved, the nanowire begins to form between the seed particle (e.g., nanocrystal) and the substrate at the growth site.

The terms "substantially perpendicular" and "substantially parallel" refer to orientations (or vectors representing populations of orientations) that vary by less than 25% and preferably by less than 5%, from a perpendicular or parallel vector, respectively.

FIG. 1 illustrates an example method 100 for fabricating aligned semiconductor nanowire lattices. Method 100 may include, at 110, twist wafer bonding a thin single crystal semiconductor film to a bulk single crystal substrate having the same material as the thin film. The film may be, for example, a semiconductor material like Si and III-IV compound semiconductor materials. While Si is primarily described in the examples, it is to be appreciated that other semiconductor materials may be employed. Furthermore, as described in connection with FIGS. 2 and 4, in some examples materials other than semiconductor materials may be employed. In one example, the film may be (111) oriented Si. The film may be, for example, about fifty angstroms to about one hundred angstroms thick. While a thickness of about fifty to about one hundred angstroms is described, it is to be appreciated that different films of different materials may have different thicknesses.

In one example, the twist wafer bonding may be performed with an angular misalignment between <011> directions of the film and the substrate. The angular misalignment may be, for example, 0.5 degrees. While an angular misalignment of 0.5 degrees is described, it is to be appreciated that different films and substrates of materials other than (111) aligned Si may have different angular misalignments. In one example, the twist wafer bonding may be performed along with backside substrate removal.

Concerning wafer bonding, it is well known that when mirror-polished, flat, clean wafers of almost any material are brought into contact under certain temperature, pressure, and/or alignment conditions, the wafers are attracted to each other by Van der Waals forces. Thus, the wafers will adhere or bond. The initial weak bonding can be supplanted with covalent bonding produced by annealing the bonded wafers at a sufficiently high temperature. Bonding two perfectly aligned identical wafers may yield a single perfectly bonded wafer without defects. However, the effect of a small twist angle as a rotational misorientation may yield a pattern of screw dislocations at the interface and this pattern may induce periodic non-uniform elastic fields on or near the surface of a wafer. These fields may be used to facilitate precisely locating where a seed alloy material will be nucleated and deposited. For example, bonding wafers with rotational twists may lead to a network of screw dislocations at the interface between the two wafers. The spacing between screw dislocations is determined by the twist angle and the materials being used. For a typical III-V material with a twist angle of 0.5 degrees, the spacing of the screw dislocations is about 50 nm.

Method 100 may also include, at 120, depositing a seed alloy material that will nucleate a plurality of nanocrystals in a periodic array pattern on the film. In different examples, the seed alloy material may be, for example, gold (Au), titanium (Ti), and other similar catalytic materials. The seed alloy material may be deposited, for example, by chemical vapor deposition and/or other deposition techniques.

The twist wafer bonding at 110 may have caused a plurality of periodic non-uniform elastic fields to be created on the surface of the film. These non-uniform fields may be used advantageously to control where the nanocrystal nucleation will occur. Similarly, the twist wafer bonding may have caused a plurality of periodic dislocation arrays to be created at an interface between the film and the substrate. Once again, these dislocation arrays may facilitate controlling nanocrystal nucleation by inducing the periodic non-uniform fields. Thus, the fields created by the dislocations, rather than a nanopatterning step, facilitate precisely locating nanowire growth spots, and thus in turn facilitate fabricating aligned nanowire lattices.

Method 100 may also include, at 130, heating the substrate to facilitate inducing formation of the nanocrystals at desired locations determined by the periodic non-uniform elastic fields. This heating may facilitate diffusing the seed alloy material on the thin film surface.

The forces that lead to the initial ordering of the nanocrystals, the dislocation and strain on the substrate, can be conveniently removed by thermally annealing the film, substrate, and/or nanocrystals after nanocrystal arrays have been formed. Thus, method 100 may also include, at 140, annealing the film, the substrate, and/or the nanocrystals at a temperature exceeding the seed alloy-substrate eutectic temperature until the nanocrystals locally alloy under the film and contact the bulk substrate, thus eliminating the dislocation and strain under nanocrystals. If the strain is not removed, as is practiced in conventional techniques, nanowires may grow in uncontrolled directions. While conventional systems may facilitate growing randomly positioned and oriented nanowires, the annealing at 140 facilitates growing a lattice of nanowires. In the lattice, the nanowires are both positioned and oriented within a desired tolerance.

Method 100 may also include, at 150, epitaxially growing a plurality of aligned nanowires of the substrate material. Due to the precise location control achieved and a stress-free single crystal substrate, the nanowires form aligned semiconductor nanowire lattices. In one example, epitaxially growing the aligned nanowires may include introducing a gas including the substrate material under VLS conditions. In one example, the Si nanowires will grow perfectly perpendicular to the (111) Si substrate. In the example, the Si nanowires will grow perfectly aligned with each other because of the epitaxial growth. In another example the Si nanowires will grow substantially parallel to each other and substantially perpendicular to the substrate.

Figure 2:
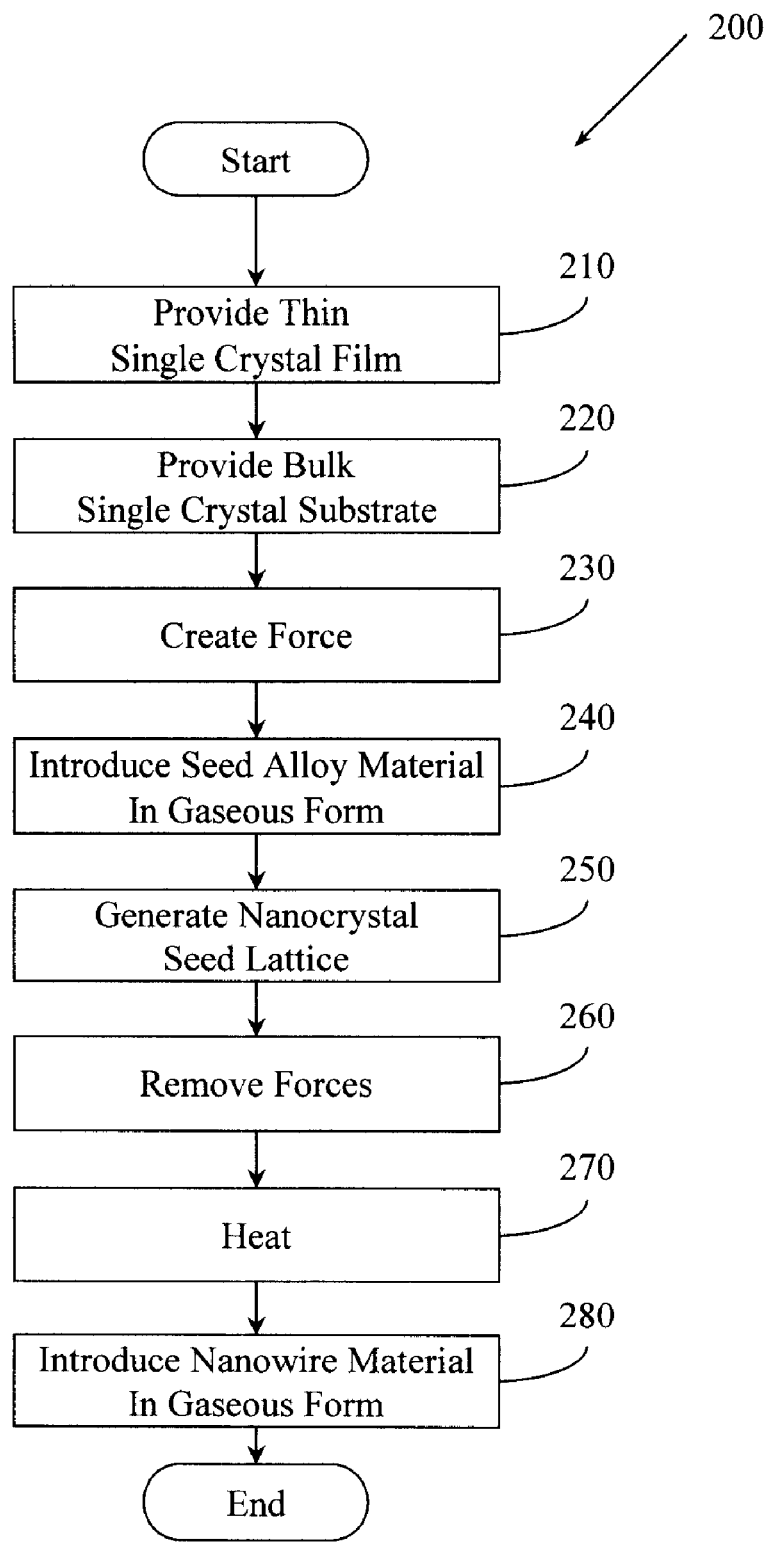
FIG. 2 illustrates an example method for fabricating a three dimensional semiconductor nanowire lattice.

FIG. 2 illustrates an example method 200 for fabricating a three dimensional semiconductor nanowire lattice. Method 200 may include, at 210, providing a thin single crystal film in a growth chamber. The thin single crystal film may be, for example, a semiconductor material like Si, or a III-IV compound semiconductor material. In one example, the film may be (111) oriented Si and may be between fifty angstroms and one hundred angstroms thick. Method 200 may also include, at 220, providing in the growth chamber a bulk single crystal substrate of the same material as the film.

Method 200 may also include, at 230, creating forces in the film and/or substrate. The forces may be created at the interface between the film and the substrate. The forces may induce an array (e.g., square array) of periodic non-uniform elastic fields on the surface of the thin film. In one example, the array of periodic non-uniform elastic fields are induced when an array of screw dislocations between the film and the substrate are produced during twist wafer bonding. In one example, the array of screw dislocations may be produced by twist wafer bonding the film and the substrate with an angular misalignment between <011> directions of the film and the substrate. In one example, the misalignment may be about 0.5 degrees. While a misalignment of about 0.5 degrees is described, it is to be appreciated that other misalignments may be employed.

Method 200 may also include, at 240, introducing a seed alloy material in a gaseous form into the growth chamber. The seed alloy material may be a catalytic material like gold (Au), titanium (Ti), and the like. In one example, the seed alloy material may be provided until, for example, a plurality of nanocrystals nucleate at a plurality of locations determined by the array of periodic non-uniform elastic fields. In another example, an amount of seed alloy material may be provided in gaseous form, where the amount is predetermined and configured to facilitate nucleating a desired amount of nanocrystals. Introducing the seed alloy material may lead to the seed alloy material being deposited at precisely controlled locations.

Method 200 may also include, at 250, generating a nanocrystal lattice on the film. Generating the lattice may include, for example, heating the film and/or substrate to facilitate inducing nucleation of the nanocrystals. This heating may facilitate diffusing the seed alloy material.

Method 200 may also include, at 260, removing the forces created at 230. Removing the forces may include annealing the nanocrystals at a temperature exceeding a substrate-seed alloy material eutectic temperature. In one example, the annealing may continue until the nanocrystals alloy under the film and contact the substrate. While one example of action 260 includes annealing the nanocrystals, it is to be appreciated that in some examples the film, the substrate, the nanocrystals and combinations thereof may be annealed.

Method 200 may also include, at 270 heating the nanocrystals, film, and/or substrate and at 280 introducing the substrate material in a gaseous form into the growth chamber under a VLS growth condition suitable to inducing epitaxial growth of a nanowire of the substrate material. While introducing the substrate material is described at 280, in some examples a different material may be introduced so long as its lattice matches that of the substrate for epitaxial growth. In one example, introducing the gas including the substrate material in a gaseous form causes a nanowire of the substrate material to grow at a nanocrystal location. For example, the substrate material, being supplied in a gaseous form, may form a molten alloy with a nanocrystal and crystallize at the substrate surface. The crystallizing will in turn provide a nucleus for nanowire growth.

Figure 3:
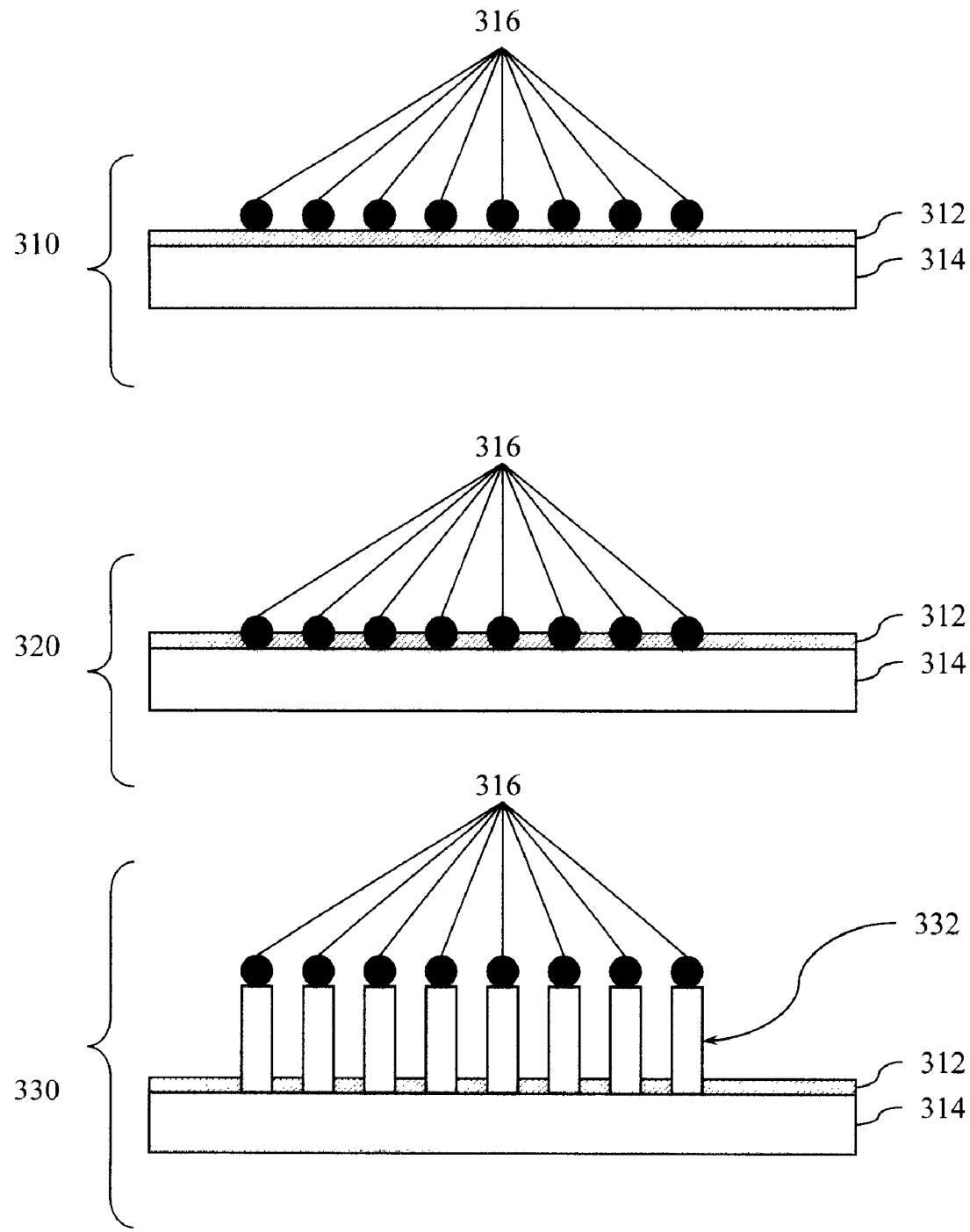
FIG. 3 illustrates three example stages encountered in fabricating aligned semiconductor nanowire lattices.

FIG. 3 illustrates three stages encountered in fabricating aligned semiconductor nanowire lattices. Stage 310 illustrates a thin single crystal film 312 that has been twist wafer bonded to a bulk single crystal substrate 314. Stage 310 also illustrates nanocrystals 316 (e.g., Au or Ti/Si) that have been aligned on film 312 in response to dislocation fields present on the surface of film 312. Stage 320 also illustrates the film 312, the substrate 314, and the nanocrystals 316 after annealing and alloying. At this point, after the annealing and alloying, dislocations and strains have been eliminated. Stage 330 illustrates an Si nanowire lattice 332 that has been produced using VLS epitaxial growth. It is to be appreciated that stages 310, 320, and 330 are sequential stages that may be produced using method 100 and/or method 200.

Silicon (Si) is used as an example semiconductor material in this description. However, in other examples, other semiconductor materials like the III-V compound semiconductors may be employed. In one example, a (111) oriented thin single crystal Si film of about 50-100 Å thickness is wafer bonded to the (111) surface of a bulk Si substrate, with an angular misalignment (e.g., 0.5 degrees) between the <011> directions, by twist wafer bonding and backside substrate removal. This twist angle introduces an array of screw dislocations between the substrate and film. The spacing between screw dislocations is determined by the misorientation angle between the film crystals and the substrate crystals. The periodic dislocation arrays at the interface induce periodic non-uniform elastic fields on the film surface. By introducing nanocrystal materials like Au or Ti into a growth chamber, nanocrystals of the introduced materials will be deposited and nucleate at surface locations where the strain is the largest. Because the nonuniform elastic field on the surface is periodic, the nanocrystals will be formed in an array on the film surface. The nanocrystals are then annealed above the eutectic temperature associated with the substrate and the nanocrystal material to alloy the nanocrystals with underlying film until the nanocrystals reach the substrate. The annealing removes dislocations from the twist bonded interface and removes strain around the nanocrystals. The stress-free nanocrystals can then facilitate inducing epitaxial growth of Si nanowires on the single crystal Si substrate under normal VLS growth conditions when a silicon-containing gas is introduced into the growth chamber. The Si nanowires will grow perpendicular to the (111) Si substrate and will be perfectly aligned with each other because of the epitaxial growth on the stress-free single crystal substrate. Since the starting nanocrystal seeds nucleated in a periodic array on the substrate surface, the nanowires grow into a 3D nanowire lattice. These 3D nanowire lattices may be used in devices including sensors, electronics, photonics, displays, lighting, and so on.

Thus, in one example, locations of nanocrystal seeds for nanowire growth are precisely controlled into a periodic array on the substrate by mesoscopic engineering of substrate stress in twist bonded substrates. This precise ordering is achieved without employing a nano patterning masking step. Because there is no extra patterning process, and because there are no extraneous materials and/or layers introduced on the substrate in this mask-less process, the substrate may stay pristine. The forces that cause the ordering of the nucleation locations of the nanocrystals (e.g., dislocations and strains on the substrate), can be conveniently removed by thermally annealing the nanocrystals on the substrate after the formation of nanocrystal arrays. Thereafter, nanowires can be epitaxially grown under VLS growth conditions. The ordering process of the nucleation locations of the nanocrystals by surface strains also facilitates improving size uniformity of nanocrystals, which leads to uniform sized nanowires.

Figure 4:
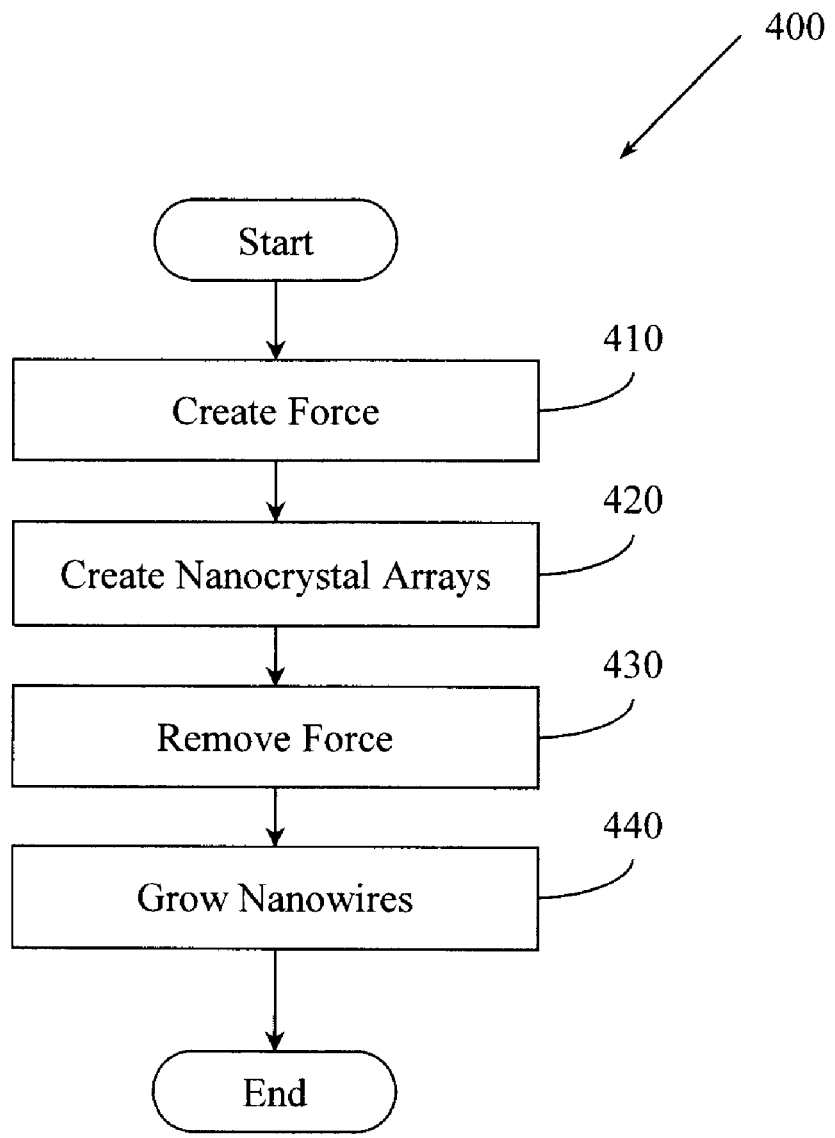
FIG. 4 illustrates an example method for fabricating a three dimensional semiconductor nanowire lattice.

FIG. 4 illustrates an example method 400 for growing nanowires. Method 400 may include, at 410, creating a force at the interface between two wafers. The force may be created, for example, by twist wafer bonding. Method 400 may also include, at 420, creating a nanocrystal array on the surface of one of the wafers. The position of the nanocrystals in the array is be controlled, at least in part, by the force created at 410. Method 400 may also include, at 430, removing the force. The force may be removed, for example by annealing the wafers and/or nanocrystal(s). While other methods may facilitate growing nanowires, removing the force at 430 by annealing the workpiece (e.g., wafers plus nanocrystals) is not typically found in conventional methods. Method 400 may then proceed to grow nanowires by, for example, epitaxial growth.

While example methods have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the methods described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method for fabricating a three dimensional nanowire lattice, comprising:
providing a thin single crystal film in a growth chamber;
providing in the growth chamber a bulk single crystal substrate of the same material as the film;
creating a force that induces an array of periodic non-uniform elastic fields on the surface of the film;
introducing a seed alloy material in a gaseous form into the growth chamber until a plurality of nanocrystals nucleate on the film at a plurality of locations determined by the array of periodic non-uniform elastic fields;
removing the force associated with inducing the array; and
after removing the force, introducing a second material in a gaseous form into the growth chamber under a vapor-liquid-solid (VLS) growth condition suitable to inducing epitaxial growth of a nanowire of the second material.

2. The method of claim 1, the film being one of Si, and a III-IV compound semiconductor material.

3. The method of claim 1, the film being (111) oriented Si and the film being between fifty angstroms and one hundred angstroms thick.

4. The method of claim 3, the array of periodic non-uniform elastic fields being induced by producing an array of screw dislocations between the film and the substrate.

5. The method of claim 4, the array of screw dislocations being produced by twist wafer bonding the film and the substrate at an angular misalignment of 0.5 degrees between <011> directions of the film and the substrate.

6. The method of claim 1, where removing the force associated with inducing the array includes annealing one or more of, the nanocrystals, the film, or the substrate at a temperature exceeding a substrate-seed alloy material eutectic temperature until the nanocrystals alloy through the film and contact the substrate.

7. The method of claim 6, where introducing the second material in a gaseous form causes a nanowire of the second material to grow at a nanocrystal location.

8. The method of claim 7, where the second material, supplied in a gaseous form, will form a molten alloy with a nanocrystal and crystallize at a substrate surface, where the crystallizing will provide a nucleus for nanowire growth.

9. The method of claim 7, the second material being the same as the substrate material.

10. The method of claim 7, the second material having a lattice pattern when grown at the nanocrystal location, the second material being a different material than the substrate material the lattice pattern matching a lattice pattern of the substrate material for epitaxial growth.

11. A method for fabricating a three dimensional nanowire lattice, comprising: providing a thin single crystal film in a growth chamber;

providing in the growth chamber a bulk single crystal substrate of the same material as the film;

creating a force that induces an array of periodic non-uniform elastic fields on a surface of the film;

introducing a seed alloy material in a gaseous form into the growth chamber to cause a plurality of nanocrystals to nucleate on the film at a plurality of locations determined by the array of periodic non-uniform elastic fields;

removing the force by causing the plurality of nanocrystals to alloy through the film and contact the substrate; and after the nanocrystals contact the substrate, introducing a second material in a gaseous form into the growth chamber under a vapor-liquid-solid (VLS) growth condition that induces epitaxial growth of a nanowire at locations of the plurality of nanocrystals.

12. The method of claim 11, where removing the force comprises annealing one or more of, the nanocrystals, the film, or the substrate.

13. The method of claim 11, where creating the force comprises applying a twist wafer bonding that introduces an array of screw dislocations between the substrate and film.

* * * * *